(12) United States Patent
Shmilovici

(10) Patent No.: US 7,660,330 B1
(45) Date of Patent: *Feb. 9, 2010

(54) CLOCK SYNCHRONIZATION AND DISTRIBUTION OVER AN OPTICAL ETHERNET NETWORK

(75) Inventor: Zvi Shmilovici, Tel Aviv (IL)

(73) Assignee: Atrica Israel Ltd., Hod Hasharon (IL)

( * ) Notice: Subject to any disclaimer, the term of this patent is extended or adjusted under 35 U.S.C. 154(b) by 306 days.

This patent is subject to a terminal disclaimer.

(21) Appl. No.: 11/538,146

(22) Filed: Oct. 3, 2006

Related U.S. Application Data

(60) Provisional application No. 60/806,039, filed on Jun. 28, 2006.

(51) Int. Cl.
*H04J 3/06* (2006.01)

(52) U.S. Cl. .............. 370/503; 370/518; 375/354; 398/154; 398/155

(58) Field of Classification Search .............. 370/503
See application file for complete search history.

(56) References Cited

U.S. PATENT DOCUMENTS

| | | | |
|---|---|---|---|
| 4,746,920 A * | 5/1988 | Nellen et al. .............. 340/825.2 |
| 6,058,479 A * | 5/2000 | Sørhaug et al. .............. 713/193 |
| 6,226,296 B1 * | 5/2001 | Lindsey et al. .............. 370/401 |
| 6,370,159 B1 * | 4/2002 | Eidson .............. 370/503 |
| 6,539,138 B2 * | 3/2003 | Holmes .............. 385/16 |
| 6,832,347 B1 * | 12/2004 | Parrish .............. 714/51 |
| 6,870,844 B2 * | 3/2005 | Tuck et al. .............. 370/390 |
| 6,943,610 B2 * | 9/2005 | Saint-Laurent .............. 327/295 |
| 2003/0039272 A1 * | 2/2003 | Dudziak et al. .............. 370/503 |
| 2004/0101311 A1 * | 5/2004 | Grohn .............. 398/154 |
| 2005/0135813 A1 * | 6/2005 | Cao .............. 398/140 |

OTHER PUBLICATIONS

"Clocks for the Synchronized Network: Common Generic Criteria", Telecordia Tehcnologies, GR-1244-COREm Issue 2, Dec. 2000, pp. 3-2 to 3-16.
International Telecommunication Union (ITU) Draft Specification G.8261, Feb. 2006, pp. 63-66.

* cited by examiner

*Primary Examiner*—Huy D Vu
*Assistant Examiner*—Stephen J Clawson
(74) *Attorney, Agent, or Firm*—Zaretsky Patent Group PC; Howard Zaretsky

(57) ABSTRACT

A novel clock synchronization mechanism for recovering and distributing a centralized clock source synchronously over asynchronous networks such as optical Ethernet. A clock conversion scheme is provided whereby multiple clocks having diverse rates are converted to clock signals all having a common rate. One of the converted clocks is chosen and all downstream clock signals is derived from this clock. A high quality clock source located anywhere on the network is distributed throughout the network thus turning an asynchronous Ethernet network into a synchronous one. Synchronous TDM data streams can then be easily transported over the Ethernet network.

29 Claims, 8 Drawing Sheets

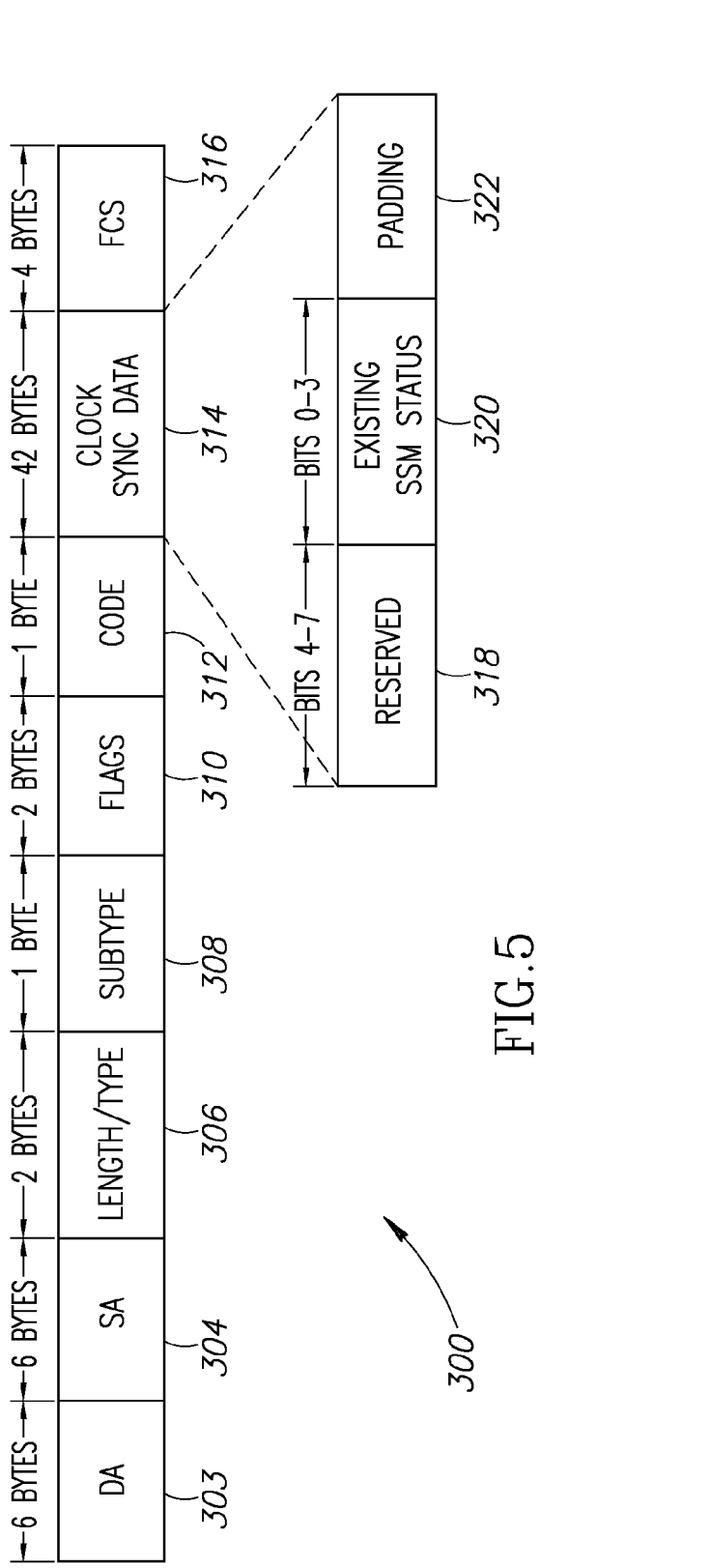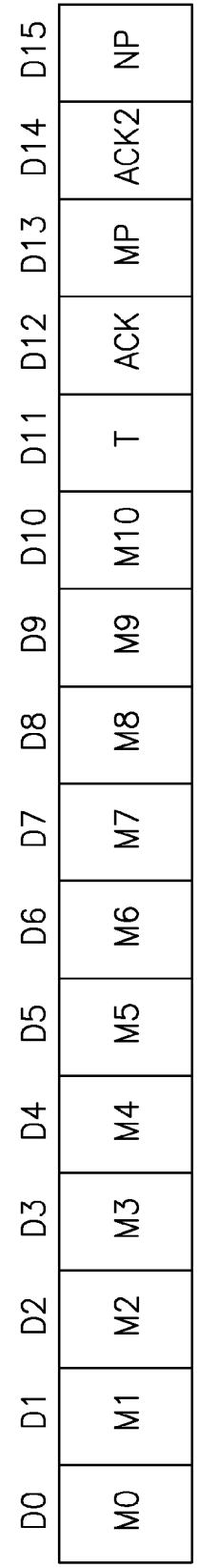
FIG.5
FIG.6

CLOCK SYNCHRONIZATION AND DISTRIBUTION OVER AN OPTICAL ETHERNET NETWORK

REFERENCE TO PRIORITY APPLICATION

This application claims priority under 35 U.S.C. §119(e) to U.S. Provisional Application Ser. No. 60/806,039, filed Jun. 28, 2006, entitled "Clock Synchronization And Distribution Over An Optical Ethernet Network," incorporated herein by reference in its entirety.

FIELD OF THE INVENTION

The present invention relates to the field of data communications and more particularly relates to a clock synchronization and distribution mechanism for use in asynchronous Ethernet networks.

BACKGROUND OF THE INVENTION

The growth in demand for telecommunication services is increasing at an ever-quickening pace. The majority of the demand is being driven by the explosion in the use of the Internet and a steady stream of new applications being introduced which further increase the demand for increased bandwidth. Currently, a large portion of the Internet traffic is still carried by circuit switched transport facilities. In the case of Metropolitan Area Networks (MANs), most of the traffic is transported over SONET/SDH based networks most of which were originally resigned designed for voice traffic.

The requirements for networked communications within the user community have changed dramatically over the past two decades. Several notable trends in the user community include (1) the overwhelming domination of Ethernet as the core networking media around the world; (2) the steady shift towards data-oriented communications and applications; and (3) the rapid growth of mixed-media applications. Such applications include everything from integrated voice/data/video communications to the now commonplace exchanges of MP3 music files and also existing voice communications which have begun to migrate towards IP/packet-oriented transport.

Ethernet has become the de facto standard for data-oriented networking within the user community. This is true not only within the corporate market, but many other market segments as well. In the corporate market, Ethernet has long dominated at all levels, especially with the advent of high-performance Ethernet switching. This includes workgroup, departmental, server and backbone/campus networks. Even though many of the Internet Service Providers (ISPs) in the market today still base their WAN-side communications on legacy circuit oriented connections (i.e. supporting Frame Relay, xDSL, ATM, SONET), their back-office communications are almost exclusively Ethernet. In the residential market, most individual users are deploying 10 or 100 Mbps Ethernet within their homes to connect PCs to printers and to other PCs (in fact, most PCs today ship with internal Ethernet cards) even though the residential community still utilizes a wide range of relatively low-speed, circuit-oriented network access technologies.

The use of Ethernet, both optical and electrical based, is increasing in carrier networks due to advantages of Ethernet and in particular Optical Ethernet, namely its ability to scale from low speeds to very high rates and its commodity-oriented nature. With the rapid increase in the demand for user bandwidth, and the equally impressive increase in the performance of Ethernet with the LAN environment, the demand for Metropolitan network performance is rapidly increasing. In response, there has been a massive explosion in the amount of fiber being installed into both new and existing facilities. This is true for both the corporate and residential markets.

A problem arises from the fact that conventional Ethernet networks are designed to transfer packets from one location to another asynchronously. Conventional Ethernet networks lack a mechanism for providing clock synchronization and distribution from a centralized clock source location. They are not capable of conveying information synchronously and thus cannot support TDM traffic streams, for example. In an asynchronous network, each node in the network generates its clock independently from all other nodes. Currently, if there is a need to transfer clocking information such as TDM traffic, other network types can be used, such as synchronous networks wherein an accurate clock source is distributed around the network. An example of a synchronous network is the well known Synchronous Optical Network (SONET)/Synchronous Data Hierarchy (SDH) network. In a SONET network, a high quality clock is distributed over the synchronous network. Existing SONET/SDH networks perform clock synchronization and distribution over a TDM based network. A short description of SONET follows.

The synchronous optical network, commonly known as SONET, is a standard for communicating digital information using lasers or light emitting diodes (LEDs) over optical fiber as defined by GR-253-CORE. It was developed to replace the Plesiochronous Digital Heirarchy (PDH) system for transporting large amounts of telephone and data traffic and to allow for interoperability between equipment from different vendors. The more recent synchronous digital hierarchy (SDH) standard developed by the International Telecommunication Union (ITU) is built on experience in the development of SONET. It is documented in standard G.707 and its extension G.708. Both SDH and SONET are widely used today; SONET in the United States and Canada, SDH in the rest of the world.

SONET differs from PDH in that the exact rates that are used to transport the data are tightly synchronized across the entire network, made possible by atomic clocks. This synchronization system allows entire inter-country networks to operate synchronously, greatly reducing the amount of buffering required between each element in the network.

Another circuit type used more and more in data networking equipment is 10 Gigabit WAN Ethernet (10 G-WIS). This is similar in rate to OC-192/STM-64, and, in its wide area variant, encapsulates its data using a light-weight SONET/SDH frame so as to be compatible at low level with equipment designed to carry those signals. 10 Gigabit LAN Ethernet, however, does not explicitly provide any interoperability at the bitstream level with other SONET/SDH systems. This differs from WDM system transponders, including both coarse- and dense-WDM systems that currently support OC-192 SONET Signals, which can normally support thin-SONET framed 10 Gigabit Ethernet.

Regarding synchronization of SONET and SDH networks, a SONET NE transports and/or multiplexes traffic that has originated from a variety of different clock sources. In addition, a SONET NE will typically have a number of different synchronization options to choose from, which in some cases it will do so dynamically based on Sync Status Messages and other indicators.

The synchronization sources available to a SONET NE typically include:

1. Local external timing generated by an atomic Cesium clock or a satellite-derived clock by a device located in the same central office as the SONET NE. The interface is typically DS1 with Sync Status Messages supplied by the clock and placed into the DS1 overhead.

2. Line-derived timing whereby a SONET NE can be configured to derive its timing from the line-level, by monitoring the S1 sync status bytes to ensure quality.

3. Using holdover wherein, in the absence of higher quality timing, a SONET NE uses its own timing circuits to time the SONET signal until a higher quality external timing becomes available again.

A disadvantage of using a SONET/SDH network for clock synchronization is the high cost of such networks. A further disadvantage is that having been developed for TDM networks, SONET/SDH networks are not optimized for Ethernet transport which transmits data asynchronously.

Thus, a problem exists in how to transfer legacy TDM traffic over an asynchronous Ethernet network and particularly, how to extract and reconstruct the TDM clock from the received data at the other side. It is important that the clock used at the receive side be traceable to the clock used at the transmitter. The clock at the transmitter side can be provided from an external source, a clock distribution network or from SONET/SDH equipment.

One prior art solution is to break the TDM traffic into several channels and convert the voice data to IP packets using DSP algorithms and then switch this IP traffic over the network. This approach, however, does not address transporting TDM traffic over asynchronous Ethernet networks.

Other schemes attempt to recover the TDM clock by maintaining a buffer and a pointer whereby if the slave clock is following the master clock, the pointer is designed to stay in the mid point of the buffer. Deviations of the slave clock from the master clock cause the pointer to move away from the mid point of the buffer. The location of the pointer is monitored and suitable action taken if it is detected to have moved.

A disadvantage of this scheme, however, is that the jitter and wonder generated is relatively high and typically does not meet common carrier telecommunication standards. In addition, the scheme cannot track the master clock in the event a large number of packets are lost and is overly sensitive to lost and erroneous packets.

Alternatively, an algorithmic approach can be used to transfer a clock. In this clock reconstruction mechanism, synchronous TDM communications traffic is transported over asynchronous networks such as Ethernet networks. The network comprises edge switches in Metropolitan Area Networks (MANs) that transport legacy TDM traffic using a Circuit Emulation Services (CES) module whereby TDM traffic is encapsulated and transported across the Ethernet network where it is de-encapsulated and clocked out to the destination. The input TDM data stream is encapsulated into Ethernet packets and a network timestamp is inserted into the packet. At the destination CES, a local timestamp is generated for each received packet as it is received. The network timestamp is extracted and input along with the local timestamp to a Digital Time Locked Loop (DPLL) which is operative to accurately reconstruct the original transmit TDM clock.

The clock quality output from this mechanism is, however, of medium quality. In addition, it is susceptible to network delays and congestion. A more detailed description of the algorithmic approach can be found in U.S. Pat. No. 7,289, 538, entitled "Clock Reconstruction for Time Division Multiplexed Traffic Transported Over Asynchronous Ethernet Networks," incorporated herein by reference in its entirety.

There is thus a need for a clock synchronization and distribution mechanism operative over an asynchronous network such as Ethernet that overcomes the disadvantages of the prior art. The mechanism should be capable of passing a high quality clock over an Ethernet physical network by making the network synchronous. Preferably, the mechanism is relatively straightforward to implement and is cost effective to make its use practical.

SUMMARY OF THE INVENTION

The present invention comprises a clock synchronization mechanism for recovering and distributing a centralized clock source synchronously over asynchronous networks such as optical Ethernet that overcomes the problems and disadvantages of the prior art. The mechanism is operative to synchronize a high quality clock signal over a physical Ethernet network utilizing a clocking conversion scheme. A high quality clock source located anywhere on the network is distributed throughout the network thus turning an asynchronous Ethernet network into a synchronous one.

The clock synchronization mechanism of the invention has several applications. One application is the distribution of synchronous TDM data streams over the Ethernet network. The TDM synchronous traffic comprises any type of synchronous data stream such as SONET/SDH/PDH data streams which include commonly found T1, E1, etc. The present invention is applicable for use with any application that requires clock synchronization, such as when synchronous traffic must be transported over asynchronous networks.

In operation, the clock synchronization mechanism receives several Ethernet input signals over communication links. Each of the received Ethernet signals has its own clock rate associated with it which may or may not be the same as the rates of other received Ethernet signals. The mechanism is capable of receiving optical Ethernet signals, TDM T1/E1 streams, a backplane clock signal or a clock from a CES card. The clocks from each of the received optical Ethernet signals are extracted and along with the received clock signals are input to a rate adaptation (or translation) circuit. The rate adaptation circuit converts the disparate rates of all the clock sources to a common rate. One of the clocks sources is selected as the primary clock and a second clock is selected as the secondary clock. One or more output Ethernet clocks are then generated based on either the primary or secondary clock.

For illustration purposes, the invention is described in the context of optical Ethernet as opposed to classical copper based Ethernet. Although the invention is described in the context of optical Ethernet, the invention is suitable for use with other networks as well, e.g., fiber channel, and it not limited to optical Ethernet networks. In particular, the invention is applicable in edge switches in Metropolitan Area Networks (MANs) that comprise some form of Circuit Emulation System (CES) adapted to segment or encapsulate TDM traffic and to transport the synchronous TDM data across the Ethernet network.

It is important to also note that the invention is not limited by the type of asynchronous network in use, the PHY layer, the type of signaling in use or by whether provisioning is based on signaling or performed in the management plane. The invention is applicable to other asynchronous networks as well.

Note also that the invention is suited for implementation in hardware such as a network processor (which may comprise a network-processor chip, an FPGA, an ASIC, etc.), adapted to implement the clock synchronization mechanism of the present invention, software or a combination of hardware and software. In one embodiment, a network device comprising a processor, memory, etc. is operative to execute software adapted to perform the clock synchronization mechanism of the present invention.

There is therefore provided in accordance with the invention, a method of clock synchronization in an optical Ethernet network, the method comprising the steps of receiving a plurality of optical Ethernet input signals, extracting a receive clock signal from each optical Ethernet input signal, each receive clock signal having a rate associated therewith, translating the rate of each receive clock signal to a common rate to generate a plurality of common rate receive clock signals, selecting a first clock signal from the plurality of common rate receive clock signals to serve as a primary clock and generating one or more Ethernet output clocks from the primary clock.

There is also provided in accordance with the invention, an apparatus for synchronous clock recovery and distribution in an optical Ethernet network comprising a plurality of clock recovery circuits, each clock recovery circuit operative to extract a receive clock signal from an optical Ethernet input signal, each optical Ethernet input signal having a rate associated therewith, a clock rate adaptation circuit operative to translate the clock rate of each receive clock signal to a rate common for all receive clock signals and to generate a plurality of common rate receive clock signals thereby, selection means for selecting one of the plurality of common rate receive clock signals to server as a primary clock and a clock regeneration circuit operative to generate one or more output Ethernet clock signals based on the primary clock.

There is further provided in accordance with the invention, a method of clock synchronization and distribution in an optical Ethernet network, the method comprising the steps of receiving a plurality of ingress data signals from optical Ethernet or time division multiplexing (TDM) signal sources, wherein at least one of the ingress data signals is derived from a high quality clock, extracting a received clock signal from each ingress data signal, adapting the rate of the received clock signals to a common rate to yield a plurality of common rate clocks, selecting a common rate clock derived from a high quality clock to serve as a primary clock and generating one or more Ethernet output clocks based on the primary clock.

There is also provided in accordance with the invention, provider edge switch for use in an optical Ethernet based network comprising a plurality of line cards incorporating one or more ports for interfacing the provider edge switch to one or more users or other provider switches, each line card comprising a plurality of ports, each port coupled to a network communications link, a packet processing engine coupled to the plurality of ports, the packet processing engine for determining forwarding decision and destination queue for each ingress packet, a queue manager coupled to the packet processing engine, a synchronous clock module for recovering and distributing a clock over the optical Ethernet network, the synchronous clock module comprising a plurality of clock recovery circuits, each clock recovery circuit operative to extract a receive clock signal from an optical Ethernet input signal, each optical Ethernet input signal having a rate associated therewith, a clock rate adaptation circuit operative to translate the clock rate of each receive clock signal to a rate common for all receive clock signals and to generate a plurality of common rate receive clock signals thereby, selection means for selecting one of the plurality of common rate receive clock signals to server as a primary clock, a clock regeneration circuit operative to generate one or more output Ethernet clock signals based on the primary clock and switching means coupled to the queue manager and adapted to provide switching fabric functionality to the provider edge switch.

There is further provided in accordance with the invention, a network device for use in an Ethernet based network comprising a plurality of line cards incorporating one or more ports for interfacing the network edge switch to one or more users, a clock synchronization circuit coupled to the plurality of ports, the clock synchronization circuit operative to recover clock signals from a plurality of received optical Ethernet signals, zero of more external clock signal sources and zero or more internal clock signal sources, adapting the rate of each recovered clock signal, the zero or more external clock signals and the zero or more internal clock signals to a single common rate so as to generate a plurality of rate adapted clock signals, selecting one of the rate adapted clock signals to be a primary clock signal and generating one or more desired Ethernet clock signals from the primary clock signal.

BRIEF DESCRIPTION OF THE DRAWINGS

The invention is herein described, by way of example only, with reference to the accompanying drawings, wherein:

FIG. 5 is a diagram illustrating the message format of an in band OAM packet adapted to convey clock synchronization status information;

FIG. 6 is a diagram illustrating the message page code of an AUTONEG Ethernet link adapted to transmit clock synchronization status information;

DETAILED DESCRIPTION OF THE INVENTION

Notation Used Throughout

Figure 1:
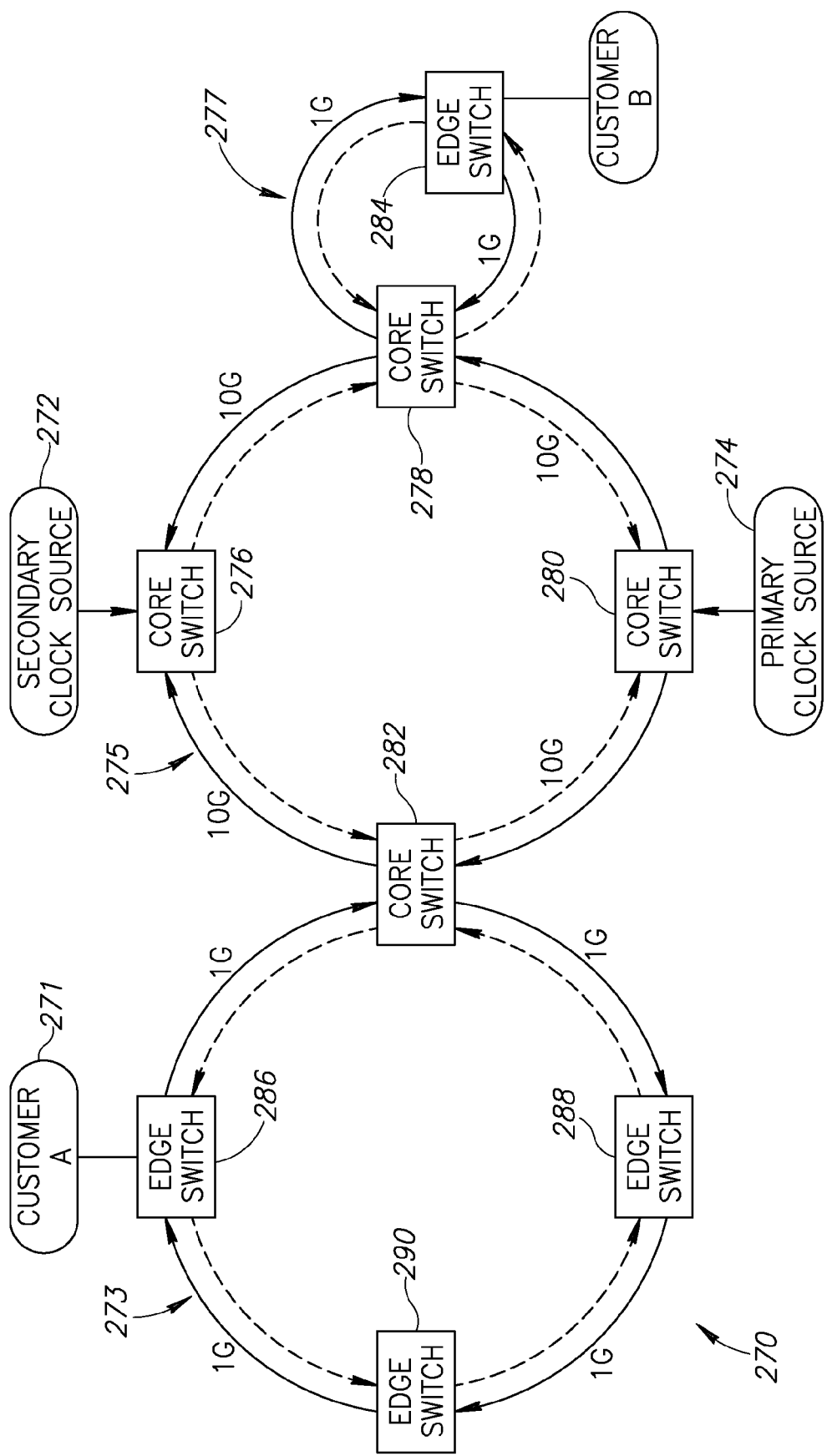
FIG. 1 is a block diagram illustrating an example optical Ethernet network adapted to distribute a high quality clock to a plurality of provider edge and provide core switches.

The following notation is used throughout this document.

| Term | Definition |
| --- | --- |
| APLL | Analog Phase Locked Loop |
| ASIC | Application Specific Integrated Circuit |
| ATM | Asynchronous Transfer Mode |
| BITS | Building Integrated Timing Supply |

-continued

| Term | Definition |
|---|---|
| CDR | Clock and Data Recovery |
| CD-ROM | Compact Disc-Read Only Memory |
| CES | Circuit Emulation System |
| CO | Central Office |
| CPU | Central Processing Unit |
| CSIX | Common Switch Interface |
| DA | Destination Address |
| DAT | Digital Audio Tape |
| DPLL | Digital Phase Locked Loop |
| DSL | Digital Subscriber Line |
| DSP | Digital Signal Processor |
| DTLL | Digital Time Locked Loop |
| DVD | Digital Versatile Disk |
| DWDM | Dense Wave Division Multiplexing |
| EEPROM | Electrically Erasable Programmable Read Only Memory |
| E-LAN | Ethernet LAN Service |
| EPROM | Erasable Programmable Read Only Memory |
| FCS | Frame Check Sequence |
| FDDI | Fiber Distributed Data Interface |
| FE | Fast Ethernet |
| FPGA | Field Programmable Gate Array |
| GE | Gigabit Ethernet |
| GPS | Global Positioning System |
| IEEE | Institute of Electrical and Electronic Engineers |
| IETF | Internet Engineering Task Force |
| IFC | Interface Card |
| IIR | Infinite Impulse Response |
| IP | Internet Protocol |
| ITU | International Telecommunication Union |
| LAN | Local Area Network |
| LED | Light Emitting Diode |
| LIU | Line Interface Unit |
| LO | Local Oscillator |
| LSP | Label Switched Path |
| LSR | Label Switched Router |
| MAC | Media Access Control |
| MAN | Metropolitan Area Network |
| MEF | Metro Ethernet Forum |
| MEN | Metro Ethernet Network |
| MP2MP | Multipoint-to-Multipoint |
| MPLS | Multi-Protocol Label Switching |
| NIC | Network Interface Card |
| NMS | Network Management System |
| OA&M | Operations, Administration & Maintenance |
| OC | Optical Carrier |
| OUI | Organizational Unique Identifier |
| PC | Personal Computer |
| PDH | Plesiochronous Digital Hierarchy |
| PDU | Protocol Data Unit |
| PE | Provider Edge |
| PPE | Packet Processing Engine |
| RAM | Random Access Memory |
| ROM | Read Only Memory |
| RPR | Resilient Packet Ring |
| RPR | Resilient Packet Ring |
| SA | Source Address |
| SDH | Synchronous Digital Hierarchy |
| SERDES | Serialization/Deserialization |
| SFP | Small Form-factor Pluggable |
| SONET | Synchronous Optical Network |
| SPE | Synchronous Payload Envelope |
| SSM | Synchronization Status Messaging |
| STM | Synchronous Transport Module |
| STS | Synchronous Transport Signal |
| TDM | Time Division Multiplexing |
| TLS | Transparent LAN Services |
| UNI | User to Network Interface |
| VLAN | Virtual Local Area Network |
| VPLS | Virtual Private LAN Service |
| VPN | Virtual Private Network |
| WAN | Wide Area Network. |
| WDM | Wave Division Multiplexing |
| XAUI | X Attachment Unit Interface |
| XFP | 10 Gigabit Small Form Factor Pluggable |

Detailed Description of the Invention

The present invention comprises a clock synchronization mechanism for recovering and distributing a centralized clock source synchronously over asynchronous networks such as optical Ethernet that overcomes the problems and disadvantages of the prior art. The mechanism is operative to synchronize a high quality clock signal over a physical Ethernet network utilizing a clocking conversion scheme. A high quality clock source located anywhere on the network is distributed throughout the network thus turning an asynchronous Ethernet network into a synchronous one.

The clock synchronization mechanism of the invention has several applications. One application is the distribution of synchronous TDM data streams over the Ethernet network. The TDM synchronous traffic comprises any type of synchronous data stream such as SONET/SDH/PDH data streams which include commonly found T1, E1, etc. The present invention is applicable for use with any application that requires clock synchronization, such as when synchronous traffic must be transported over asynchronous networks.

For illustration purposes, the invention is described in the context of optical Ethernet as opposed to classical copper based Ethernet. Although the invention is described in the context of optical Ethernet, the invention is suitable for use with other networks as well, e.g., fiber channel, and it not limited to optical Ethernet networks. In particular, the invention is applicable in edge switches in Metropolitan Area Networks (MANs) that comprise some form of Circuit Emulation System (CES) adapted to segment or encapsulate TDM traffic and to transport the synchronous TDM data across the Ethernet network.

It is important to also note that the invention is not limited by the type of asynchronous network in use, the PHY layer, the type of signaling in use or by whether provisioning is based on signaling or performed in the management plane. The invention is applicable to other asynchronous networks as well.

Throughout this document, the terms packet and frame are used interchangeably and are intended to denote a protocol data unit (PDU) adapted to transport data and/or control information from one point to another.

A block diagram illustrating an example optical Ethernet network adapted to distribute a high quality clock to a plurality of provider edge and provide core switches is shown in FIG. 1. The example network, generally referenced 270, comprises a plurality of customers 271, labeled customer A and B connected to the optical Ethernet network, a plurality of optical rings 273, 275, 277, a primary clock source 274 and a secondary clock source 272. Customer A is connected to fiber ring 273 comprising provider edge switches 286, 288, 290 and provider core switch 282. The primary and secondary clock sources are connected to optical ring 275 comprising provider core switch 276, 278, 280, 282. Customer B is connected to fiber ring 277 comprising provider edge switch 284 and provider core switch 278. Provider core switch 282 is shared between fiber rings 273 and 275 while provider core switch 278 is shared between fiber rings 275 and 277.

The provider edge switches and the provider core switches are operative to implement the clock synchronization mechanism of the present invention in addition to performing standard edge and core switch functions.

In this example network, two high quality clock sources 274, 272 are available to the network. Note that any number of clock sources may be available to synchronize the entire network. In accordance with the invention, provider core switch 280 is operative to select the external primary clock source as its internal primary clock and uses this clock to generate any and all necessary clock signals for output Ethernet signal generation. The Ethernet signals output from provider core switch 280 are distributed throughout the network as indicated by the solid block arrows connected to the provider edge and core switches. These arrows represent 1 G or 10 G (as indicated) optical Ethernet communication links. Note that clock synchronization passes between the different domains, i.e. between 1 G and 10 G Ethernet domains.

Provider core switch 276 receives external secondary clock source 272. It also receives an optical Ethernet signal transmitted from provider core switch 278, which in turn received an optical Ethernet signal from provider core switch 280. Thus, the timing of the Ethernet signal received at provider core switch 276 is ultimately derived from the primary clock source. Switch 276 has available to it clock signals derived from its received optical Ethernet signals and the external secondary clock source. Although the high quality secondary clock source is available to provider core switch 276, the control software, hardware or combination thereof, will likely select the optical Ethernet clock derived from the primary clock source. In the event of a loss of the primary clock source, control means in the network and provider switches would select the secondary clock source to use in generating the output Ethernet transmission signals.

Provider Switch Embodiment

A network device can be adapted to incorporate the clock synchronization mechanism of the present invention. Hardware means and/or software means adapted to execute the mechanism may be incorporated, for example, within the line cards of a network device such as a core switch, access switch, provider switch, enterprise switch, Network Management System (NMS), Label Switching Router (LSR), Ethernet LAN switch, network switch or any other wired or wireless network device. The network device may be constructed using any combination of hardware and/or software. A provider switch is defined as any switch used by a service provider. Examples of provider switches include edge switches, core switches and access switches. An enterprise switch is defined as any switch used within an enterprise, such as the switches used within a corporation, college campus, etc.

Figure 2:
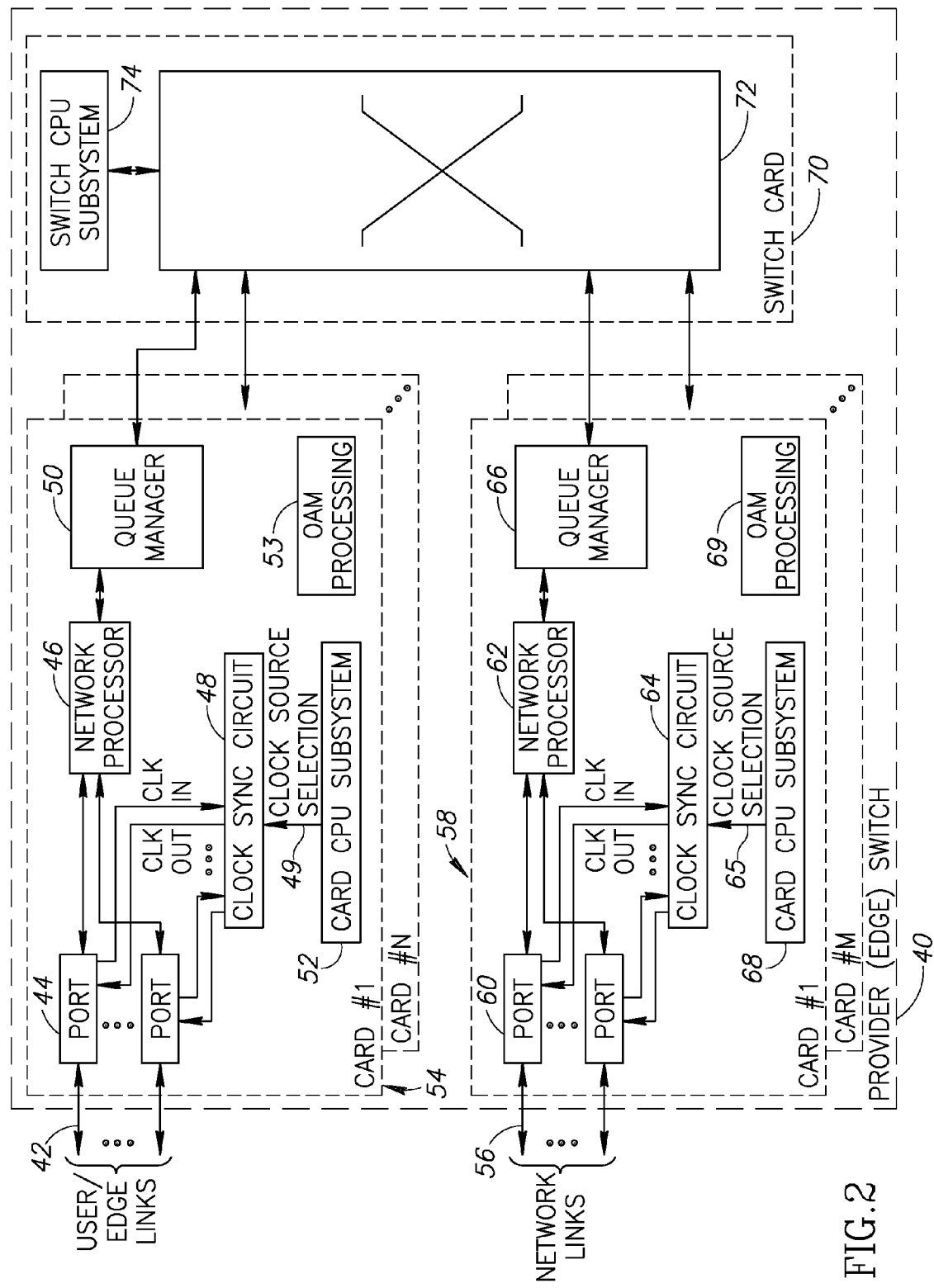
FIG. 2 is a block diagram illustrating an example provider edge/provider core switch incorporating the synchronous clock recovery and distribution mechanism of the present invention.
Figure 3:
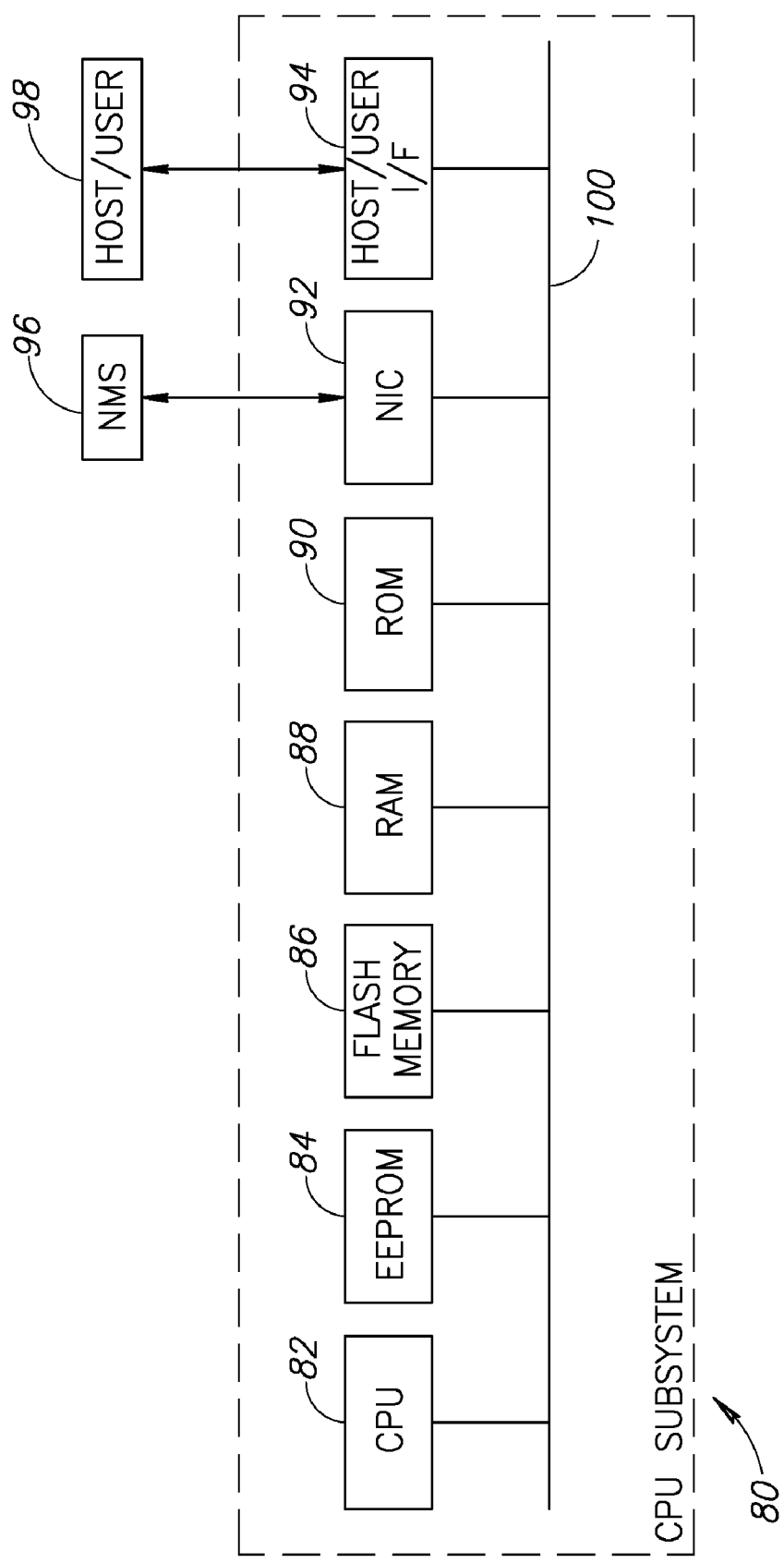
FIG. 3 is a block diagram illustrating the CPU subsystems of the provider edge/provider core switch of FIG. 2 in more detail.

As an example, the invention is applied to a provider edge switch and a provider (core or middle) switch. A block diagram illustrating an example provider edge/provider core switch incorporating the synchronous clock recovery and distribution mechanism of the present invention is shown in FIG. 2. A block diagram illustrating the CPU subsystems of the provider edge/provider core switch of FIG. 2 in more detail is shown in FIG. 3. With reference to FIGS. 2 and 3, the provider switch, generally referenced 40, is modularly constructed and comprises a plurality of provider edge line interface cards 54, labeled card #1 through card #N, a plurality of provider core line interface cards 58, labeled card #1 through card #M and one or more switch cards 70. Note that user edge links and network links can reside on the same card. Each card 54 comprises a plurality of ports 44, network processor or packet processing engine (PPE) 46, queue manager 50, card CPU subsystem 52, clock synchronization circuit 48 and OAM processing module 53. Each card 58 comprises a plurality of ports 60, network processor or PPE 62, queue manager 66, card CPU subsystem 68, clock synchronization circuit 64 and OAM processing module 69. The line cards 54 function to provide an interface to users/edge devices communication links 42. The line cards 58 function to provide an interface to network communication links 56. The switch card provides a switching function whereby packets are transferred between line cards (or between ports).

The clock synchronization circuit 48, in combination with the plurality of ports 44 and CPU subsystem 52, implements the clock synchronization mechanism of the present invention. Similarly, the clock synchronization circuit 64, in combination with the plurality of ports 60 and CPU subsystem 68, implements the clock synchronization mechanism of the present invention. Note that the functionality of the clock synchronization circuits is preferably implemented in hardware but may also be implemented in software or a combination of software depending on the particular implementation.

In one embodiment, the ports are adapted to provide the clock signals extracted from the received optical Ethernet input signals. In this case, the clock extraction is performed by the ports while rate adaptation, clock signal processing and regeneration are performed by the clock synchronization circuit. Alternatively, the ports may be adapted to simply provide the received Ethernet input signals whereby clock extraction, rate adaptation, clock signal processing and regeneration are performed by the clock synchronization circuit. It is appreciated that the apportioning of functionality between the various blocks of the line cards is not critical to operation of the invention. The regenerated Ethernet clock signals are output of the clock synchronization circuit and used by the ports in generating the output Ethernet transmit signals.

The communication links 42 are terminated at the line cards via the plurality of ports 44. The communication links 56 are terminated at the line cards via the plurality of ports 60. Regardless of what type of links they are connected to, the ports function to provide the PHY interface to the bidirectional communication links. The line interface cards may be adapted to interface to any particular type of link including, for example, any variety of copper or optical based Ethernet, Token Ring, FDDI, SONET/SDH, ATM, RPR. In addition, a line card may have a plurality of ports each adapted to communicate over a different type of link. For connecting to a user or edge device, the port is adapted to connect directly or indirectly through access/aggregation devices to a plurality of users or customer/client edge devices via communication links 42. The client edge ports of the provider switch interface to the user or client edge device via any suitable type of interface, e.g., Gigabit Ethernet (GE), Fast Ethernet (FE), PDH interface (e.g., T1/E1), etc. Similarly, if the port connects to a network link 56, the port functions to interface the line card to other provider switches (i.e. edge or core switches) via any suitable interface such as Optical Ethernet (e.g., 1 GE, 10 GE, etc.), TDM, RPR, etc.

Data received over the links 42 by the ports is forwarded to the packet processing engine (PPE) or network processor 46. Data received over the links 56 by the ports is forwarded to the packet processing engine (PPE) or network processor 62. The packet processing engines 46, 62 perform packet processing on the packets received from the ports. Some of the key functions performed by the packet processing engine include determining the discard eligibility of each packet, calculating a forwarding decision for each packet, determining which queue to forward the packet to and making any necessary changes to a packet.

The packet processing engines 46, 62 comprise both an ingress packet processor (not shown) and an egress packet processor (not shown). The packet processing engine typically also comprises timestamp circuits, clock circuits, memory, counters and CPU interface, means for performing OA&M protocols processing (part of this capability may reside in the CPU as well). The PPE 46 comprises an ingress policer (not shown) intended to be located in a provider edge switch and which is operative to make marking decisions based on the contents of the received packet and the current traffic conditions. The PPE 62 may comprises the middle policer (not shown) intended to be located in a provider core switch and which is operative to make marking decisions based on the contents of the received packets and the current traffic conditions.

The packet processing engine may be implemented as a microcontroller, microprocessor, microcomputer, ASIC core, FPGA core, network processor, central processing unit (CPU) or digital signal processor (DSP) or any other suitable computing means. Once processing is complete, the packet processing engine passes packets to the queue manager which functions to place the packet in the appropriate ingress queue.

The queue managers functions to manage the various queues within the line card. A plurality of queues is typically used wherein separate queues are provided for different priorities, destinations, etc. Note that the invention is not limited to any particular line interface type or link speed. In addition, the invention is not limited to any particular number of communication links or ports, as any number of links and ports of each type may be used. Further, the line interface cards may be adapted to interface to any type of communication links such as any variety of copper or optical based Ethernet, Token Ring, FDDI, SONET/SDH, PDH, ATM, RPR, etc. Note that the queue management system is typically constructed in hardware in order to provide a high bandwidth fast path for data that is capable of keeping up with the line rates of the communication links.

Note that the specific implementation of the line card is not critical to the invention. For example, a single packet processing engine may be adapted to handle a plurality of ports or a plurality of packet processing engines may be used, one for each port. Similarly, a single queue manager per line card may be used or a plurality of queue managers may be used, one for each packet processing engine (in the case multiple packet processing engines are realized). Further, the switch CPU subsystem may be incorporated on the same card as the switching matrix or may be realized on a separated card in the chassis.

Each of the line cards 54 comprises a card CPU subsystem 52 for providing the control, administration and configuration of the line card. The CPU subsystem provides the clock source selection control signal input to the clock synchronization circuit. The clock source selection control signal is used to determine which of the plurality of available common rate clock signals is chosen to serve as the primary and the secondary clock signals.

Each of the line cards 58 comprises a card CPU subsystem 68 for providing the control, administration and configuration of the line card. A detailed block diagram of the CPU subsystem suitable for use in both line card CPU subsystems and the switch card CPU subsystem is shown in FIG. 5. The CPU subsystem, generally referenced 80, comprises a central processor 82, e.g., CPU, and both volatile and non-volatile memory including RAM memory 88 for storing data and application program code, Flash memory 86 and/or ROM memory 90 for storing boot and application code and EEPROM 84 for storing configuration data. The provider switch may also comprise magnetic storage device means for storing application programs and data. The CPU communicates to the packet processing engine, memory peripherals and other support devices via a bus 100. Note that depending on the implementation, the line cards may not have a CPU subsystem or may have a minimal CPU subsystem, such as without external interfaces.

The central processor 82 implements the major functionality of the control and management planes of the line card including higher software layer processing. Note that the central processor may be implemented in any suitable form such as a microcontroller, microprocessor, microcomputer, ASIC core, FPGA core, central processing unit (CPU) or digital signal processor (DSP) or any other computing means.

The CPU subsystem also comprises a NIC 92 for providing an out of band interface for connecting to external entities such as a craft for local maintenance and configuration purposes, an NMS 96 for centralized provisioning, administration and control or a Local Area Network (LAN). The CPU subsystem switch may comprise additional interfaces, such as a serial interface for connecting to a PC for configuration purposes. Note that these interfaces are typically part of the CPU subsystem that manages the chassis.

The network device also comprises an optional user interface 94 adapted to respond to user/operator inputs and commands and to provide feedback and other status information. A host/user interface 94 enables communication with a user or host-computing device 98. The host may be adapted to configure, control and maintain the operation of the provider switch. Note that these interfaces are typically part of the CPU subsystem that manages the chassis.

In the ingress direction, data output from the queues on each of the line cards is forwarded to the switching matrix. The switch matrix implements the switching fabric (switching matrix block 72) for providing the switching functionality of the provider switch. A switch CPU subsystem 74 (described supra) provides a centralized processing function for the switch matrix. The switch CPU subsystem may also serve as the central CPU for the chassis, optionally residing on a separate card and managing chassis resources such as fans and power, as well as providing a single point of management for the entire chassis, i.e., representing the other cards to the user or craft. The switch CPU subsystem may comprise the CPU subsystem shown in FIG. 3 and described hereinabove. Note that depending on the specific implementation, the switching matrix may comprise, for example, hardware for performing VLAN tagging, MPLS, Frame Relay, ATM switching, CSIX, OIF-SPI.4, or any other switch matrix to network interface protocol.

In the egress direction, the switch matrix forwards the traffic towards the egress port, through the egress queue. The egress queue sends flow control to the switch matrix when it becomes full (or almost full). The switch matrix propagates the flow control to the relevant ingress queues, which are those that sent packets towards that egress queue.

A plurality of provider switches may be connected to each other using any topology. The switches may support any kind of a switching technology, including MAC-based switching, VLAN-based switching, MPLS, ATM, etc. Alternatively, the network may comprise only provider edge switches whereby a plurality of provider edge switches are connected in a ring topology.

The provider switch comprises computer readable storage medium for storing program code and data which may include any suitable memory means including but not limited to magnetic storage, optical storage, CD-ROM drive, ZIP drive, DVD drive, DAT cassette, semiconductor based volatile or non-volatile memory, biological memory devices, or any other memory storage device.

Software operative to implement the functionality of the present invention is adapted to reside on a computer readable medium, such as a magnetic disk within a disk drive unit or any other volatile or nonvolatile memory. Alternatively, the computer readable medium may comprise a floppy disk, Flash memory, EPROM, EEPROM based memory, bubble memory storage, ROM storage, etc. The software adapted to perform mechanisms and methods of the present invention or any portion thereof may also reside, in whole or in part, in the static or dynamic main memories or in firmware within the processor of the switch (i.e. within microcontroller, microprocessor, microcomputer, DSP, etc. internal memory).

Clock Synchronization Circuit

Classical Ethernet networks use copper for the physical interface (i.e. Layer 1 or PHY) communication links between nodes and for shared media between two or more ports (i.e. point to multipoint). Data rates of 10, 100 and 1000 Mbps are available on copper based Ethernet connections. Copper based Ethernet transmits packets asynchronously, sending packets out onto the line only when it needs too. The remainder of the time, the copper line is idle and is not used at all.

In contrast to copper Ethernet, only point-to-point connections are used in optical Ethernet networks. Optical Ethernet links use coding for transmitting the bits over the point-to-point optical fiber communication links. Conventional 1 G Ethernet uses 8b/10B coding, 10 G LAN Ethernet uses 66/64 coding and 10 G WAN Ethernet uses SONET framing. In each of these Ethernet schemes, physical coding bits are always transmitted on the communication line even when there are no packets to send. In optical Ethernet, idle sequences are transmitted when there are no packets to transmit. Thus, in optical Ethernet, there is perpetual activity on the optical lines.

Perpetual transmission activity on the optical communication line means that there is always an optical Ethernet signal available from which a clock can be recovered. The clock synchronization mechanism of the present invention utilizes this to (1) extract clock signals from the received optical Ethernet signals which may have different rates, (2) perform rate adaptation whereby all the clock signals are converted to a common rate, and (3) select one of the clocks to be used to generate a plurality of Ethernet clock signals that are used to generate Ethernet output transmit signals.

Figure 4:
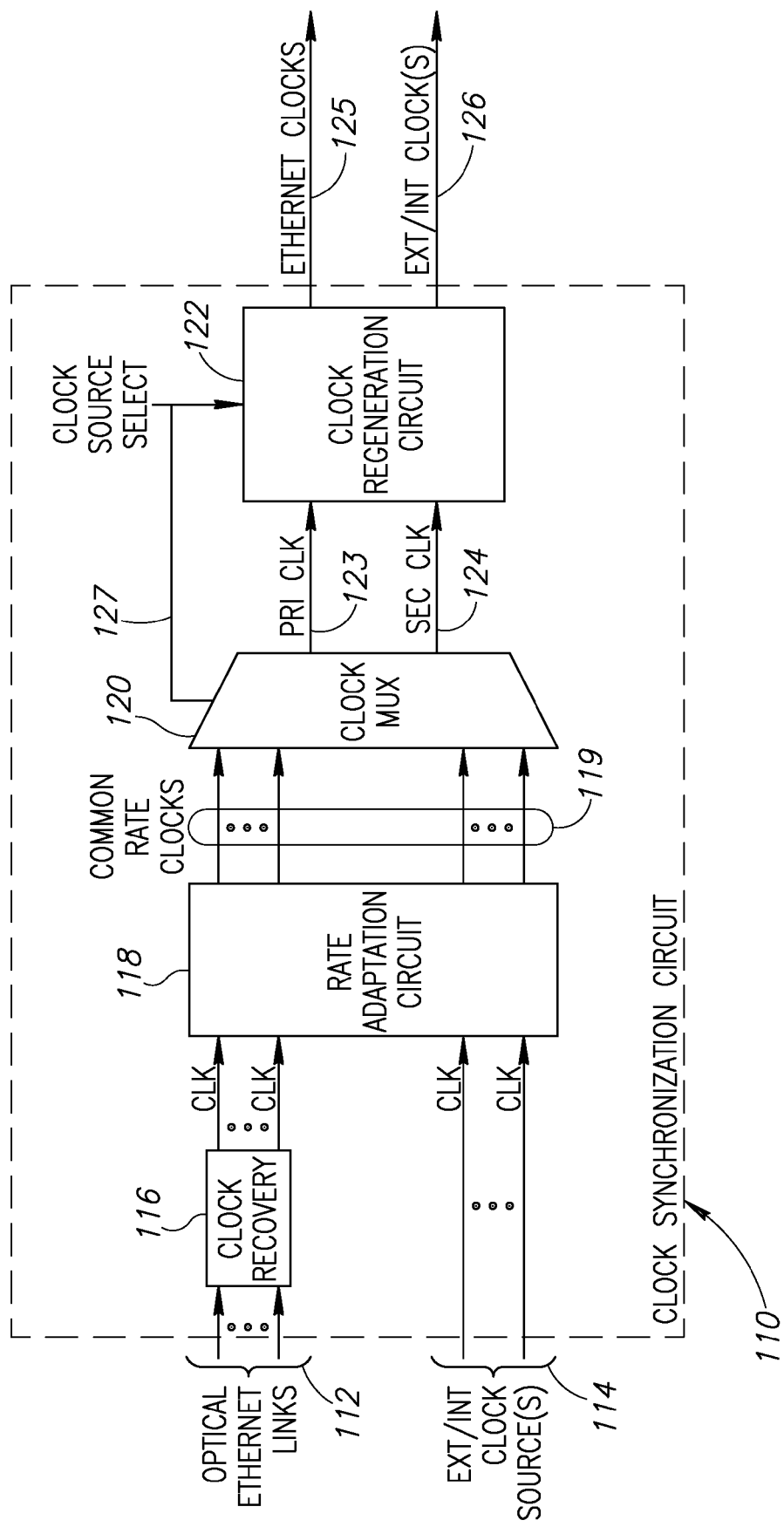
FIG. 4 is a block diagram illustrating an example clock synchronization circuit of the present invention.

A block diagram illustrating an example clock synchronization circuit of the present invention is shown in FIG. 4. The clock synchronization circuit, generally referenced 110, comprises a clock recovery circuit 116, rate adaptation circuit 118, selection means 120 and clock regeneration circuit 122.

In operation, one or more optical Ethernet signals received over optical Ethernet communication links 112 are input to the clock recovery circuit. Other external or internal clock sources 114 may also be input to the clock recovery circuit as well. Examples of external or internal clock sources include external high quality clock sources such as from SONET/SDH networks, Stratum 3 clocks, satellite sources, internal CES card clocks, backplane clocks from other cards, etc.

The clock recovery circuit functions to extract the clock from each of the received optical Ethernet signals. This may be accomplished in any of several ways as described infra. Clock recovery techniques for both copper and optical Ethernet signals are well known in the art. Commercial devices are available to perform this task for optical Ethernet signals, such as the PM8363, a 4 channel physical layer transceiver with gigabit Ethernet PCS, manufactured by PMC Sierra, Santa Clara, Calif., USA.

The clock signals output of the clock recovery circuit and the external and internal clock signals are input to the rate adaptation circuit. It is noted that each of the input clock signals may have a rate independent of the rate of the other clock signals. The rate adaptation circuit functions to translate the rate of each of the input clocks to a common rate that is shared across all input clock signals. Thus, the rate adaptation circuit functions to convert all the input clock signals to output clock signals 119 wherein the rate of each output clock signal is the same. In the example embodiment presented herein, the common rate is 8 kHz, which is the SONET/SDH rate. It is appreciated, however, that the invention is not limited to this common rate as any common rate may be used depending on the particular implementation.

The common rate clocks output of the rate adaptation circuit are input to a selection means, e.g., a multiplexer, which functions to select one of the common rate clocks to serve as the primary clock 123 and one to server as the secondary clock 124. A clock source select signal 127 determines which of the common rate clocks are to be selected. The clock source select signal may be provided by any suitable means such as the CPU subsystem 52, 68 (FIG. 2). Normally, the clock source having derived from the highest quality clock source is selected as the primary clock. The controller or other higher layer entity has or is provided knowledge of the clock signals available to the device. For example, if one of the external clock sources comprises a high quality clock provided by a service provider (e.g., SONET/SDH, Stratum 3 or other clock source), the clock source select signal would be adapted to select that particular source to serve as the primary clock.

The primary and secondary clock signals are input to the clock regeneration circuit which is operative to perform all necessary clock signal processing functions such as phase locking, holdover, smooth switchover, jitter attenuation and wander filtering.

Generating and distributing a quality output clock signal requires performing several processing functions on the clock signal at the Ethernet rate. These include jitter attenuation, holdover, wander filtering and smooth clock switchover. Available devices or custom chip solutions such as an ASIC or FPGA device may be used to translate Ethernet rates to TDM rates.

Holdover is a function used when the clock source is absent and is adapted to hold the last clock frequency with same defined maximum drift as defined in the well known Stratum 3 standard. Smooth switchover is implemented so that switching from one clock to another will not cause a disruption of the clock phase, thus avoiding any bit errors. A filter is used to achieve high jitter performance, i.e. low jitter present in the output clock signals, tolerance to high jitter on the input and the capability to filter jitter on the input in accordance with common TDM standards. A wander filter improves wander performance by achieving a very low rate of clock phase change.

The clock regeneration circuit is also operative to generate any required Ethernet clock signals 125 and external or internal clock signals 126 using the primary (or secondary) clock signals as the reference. The clock source select signal determines whether the primary or secondary clock is used by the clock regeneration circuit to generate the output clock signals.

It is noted that in order to meet the clock frequency accuracy requirement of ±100 ppm, as dictated by the Ethernet standard, the invention is operative to distribute the same clock at each port on each node. To achieve this, the mechanism of the invention distributes the clock using the physical layer of optical Ethernet. Only a single node needs to receive the quality external clock which is then used to synchronize the entire network. Each node in the network implementing the present invention selects one clock from the various different sources to synchronize all communication links connected to it. Each node is operative to recover the clock from all optical links connected to it and to use any of these clocks for distribution to the network. Further, each node is operative to perform jitter attenuation of the particular clock used for distribution. In addition, the invention comprises means for passing synchronization status messaging (SSM) messages between nodes for communicating clock quality information between nodes.

Conventional Ethernet PHY devices do not normally provide the recovered clock as an output. Therefore, the mechanism of the invention overcomes this by passing the signal from each serial link through a repeater device that copies the Ethernet signal sending one signal to the MAC (for data recovery) and the second signal to the clock recovery circuit 116 (FIG. 4) for recovering the clock. Note also that unlike TDM rates (8 kHz) there is no common rate that can be used on all Ethernet interfaces. Therefore, the clock regeneration circuit 112 (FIG. 4) is used to convert from the common rate (8 kHz) to each particular Ethernet rate needed.

Synchronization Messaging

As described supra, the clock synchronization mechanism of the invention implements synchronization status messaging (SSM) between nodes whereby information about the quality of the clock signal is transferred from one node to another. It is noted that there are no headers in Ethernet that are dedicated to SSM. Therefore, the invention provides two alternative embodiments for implementing SSM in an Ethernet network. The first uses special in band packets containing the SSM information. The second uses the auto negotiation (AUTONEG) capabilities of Ethernet.

A diagram illustrating the message format of an in band OAM packet adapted to convey clock synchronization status information is shown in FIG. 5. The 64-byte OAM Ethernet packets, generally referenced 300, are dedicated to transferring SSM information. Each comprises a 6-byte destination address (DA) 302, 6-bytes source address (SA) 304, 2-byte OAMPDU length/type field 306 having a slow protocol type field value of 8809, 1-byte OAMPDU subtype field 308 wherein identification of slow protocol being encapsulated for OAMPDU=0x03, 2-byte flags field 310, 1-byte code field 312 which identifies the specific OAMPDU type set to FE, 42-byte clock sync data field 314 Organizational Unique Identifier (OUI) where the first 3-bytes of data include the OUI and a 4-byte frame check sequence (FCS).

The clock sync data field comprises a plurality of fields including a 4-bit field 320 for conveying the existing SSM status as given in the ITU-T G.707 standard. The remaining 4-bit field 318 is reserved and a padding field 322 is used to fill the packet to 64 bytes. Note that implementing OAM packets for SSM messaging distribution requires the modification of several packet processing entities including the network processor, Ethernet switch, etc. to handle the processing of the OAM SSM messages.

A diagram illustrating the message page code of an AUTONEG Ethernet link adapted to transmit clock synchronization status information is shown in FIG. 6. Using the well-known "next page" capabilities as described in the IEEE 802.3 standard, 4-bit SSM messages are transmitted over the AUTONEG physical Ethernet communications link on fields M[0:3] on the message page code 130. Note that this scheme of sending SSM information has the advantage of being a physical layer attribute that does not require modification of packet processing entities such as the network processor, Ethernet switch, etc. to process the SSM messages, thus providing a simpler implementation than the OAM SSM Ethernet message scheme described supra.

1 G Optical Ethernet Clock Synchronization

Figure 7:
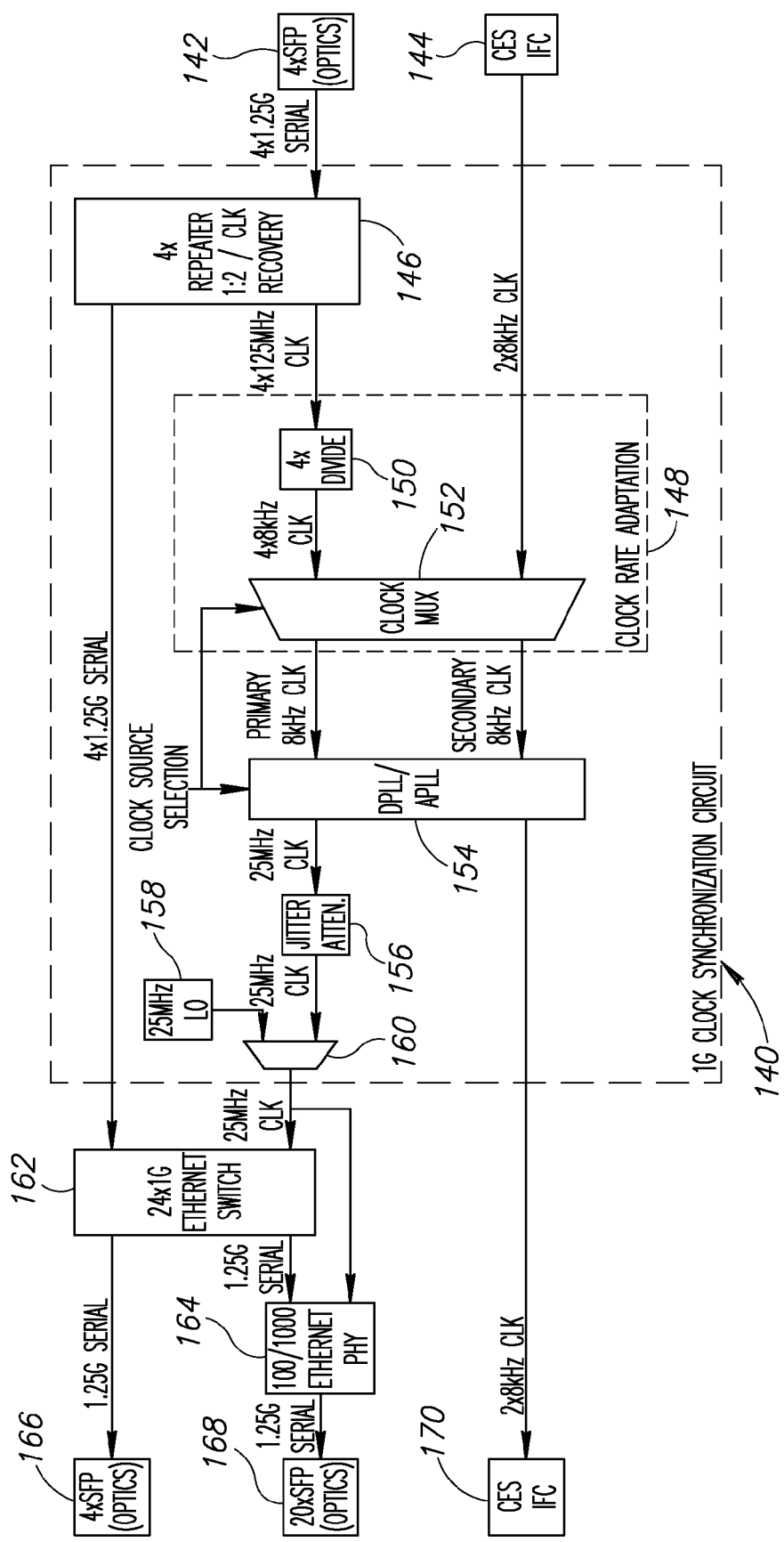
FIG. 7 is a block diagram illustrating an example 1 G clock synchronization circuit of the present invention.

A block diagram illustrating an example 1 G Ethernet clock synchronization circuit of the present invention for distributing a TDM clock is shown in FIG. 7. The example implementation described is capable of handling four 1 G optical Ethernet links. This example circuit is presented for illustration purposes only and it not intended to limit the scope of the invention as clock synchronization circuits adapted to handle any number of links may be constructed by one skilled in the art using the principles of the present invention.

The clock synchronization circuit, generally referenced 140, comprises four 1:2 repeaters 146 performing clock recovery function, clock rate adaptation block 148, digital phase locked loop (DPLL)/analog PLL (APLL) 154, jitter attenuation block 156, 25 MHz local oscillator (LO) 158 and multiplexer 160.

In operation, the ingress 1 G optical Ethernet signals terminate on the SFP optics 142. The four 1.25 G serial signals are input to the repeater and clock recovery circuit 146 which functions to perform Ethernet clock recovery and distribution of the raw Ethernet data. The four 1.25 G raw Ethernet serial data streams signals are input to the Ethernet switch 162. The four 125 MHz clock signals are input to the clock divider circuit 150 in the clock rate adaptation block 148. The clock divider functions to divide the each of the four clock signals down to a common rate of 8 kHz. The four common rate clock signals are input to multiplexer 152. Also input to the multiplexer are two 8 kHz clock signals input from the CES interface card 144. A clock source selection signal determines one of the six common rate clock signals to be the primary clock and one to be the secondary clock. The selection would be made to choose the input signal (i.e. optical Ethernet or CES clocks) that was derived from a high quality clock.

The primary and secondary common rate clocks are input to the DPLL/APLL 154 or other clock signal processing circuitry which performs all necessary functions such as jitter attenuation, holdover, smooth switchover and wander filtering. The clock source selection signal selects either the primary or secondary clock to use to generate the output clocks, i.e. the 25 MHz clock and two 8 kHz clocks which are returned to the CES interface card 170 for generating transmit signals. The 25 MHz clock is passed through a jitter attenuation circuit 156 for filtering out jitter in the clock signal. Note that this function may be performed by the DPLL or other equivalent circuit. The output of the jitter attenuation circuit is multiplexed with a 25 MHz LO 158. The multiplexer is used to select either a normal mode or 'sync over Ethernet' mode. In normal mode, the clock output is used in the event no other clock signal is available or it is not desired to be in 'sync over Ethernet' mode. The 25 MHz clock output of the multiplexer is used as the clock source to the Ethernet switch 162 and to the 100/1000 Mbps Ethernet PHY 164. The 1.25 G serial streams output of the Ethernet switch is input to the SFP optics 166. The output of the Ethernet PHY 164 is input to the SFP optics 168. Note that the 25 MHz clock output of the multiplexer may also be input to the network processor where it is used to synchronize the data output of the network processor.

1 G/10 G Optical Ethernet Clock Synchronization

Figure 8:
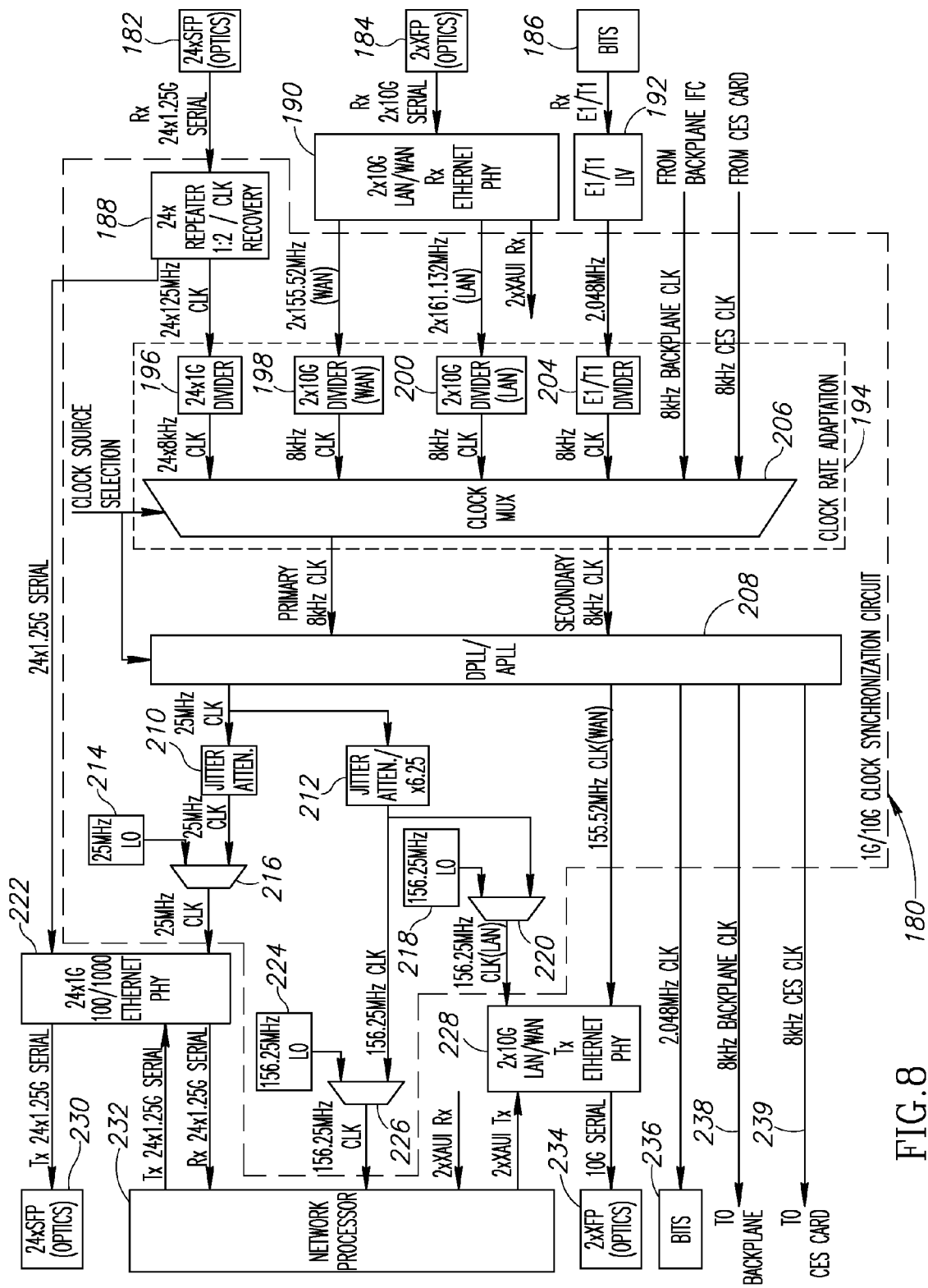
FIG. 8 is a block diagram illustrating an example 1 G/10 G clock synchronization circuit of the present invention.

A block diagram illustrating an example 1 G/10 G clock synchronization circuit of the present invention is shown in FIG. 8. The example implementation described is capable of handling 24 1 G optical Ethernet links, two 10 G optical Ethernet links, E1/T1 TDM signals and CES generated clocks. This example circuit is presented for illustration purposes only and it not intended to limit the scope of the invention as clock synchronization circuits adapted to handle any number of inputs (e.g., Ethernet links, TDM inputs, etc.) may be constructed by one skilled in the art using the principles of the present invention.

The clock synchronization circuit, generally referenced 180, comprises 24 1:2 repeater and clock recovery circuits 188 performing clock recovery, clock rate adaptation block 194, DPLL/APLL 208, jitter attenuation blocks 210, 212, local oscillator 214, 218, 224 and multiplexers 216, 220, 226.

The operation of the 1 G portion of the synchronization circuit 180 is similar to that of the circuit of FIG. 7. The ingress 1 G optical Ethernet signals terminate on the SFP optics 182. The 24 1.25 G serial streams are input to the 24 repeater and clock recovery circuits 188 which function to perform Ethernet clock recovery and distribution of the raw Ethernet data. The 24 1.25 G raw Ethernet serial data streams are input to the Ethernet switch 222. The 24 125 MHz clock signals are input to the clock divider circuit 196 in the clock rate adaptation block 194. The clock divider functions to divide the each of the 24 clock signals down to the common rate of 8 kHz. The 24 common rate clock signals are input to multiplexer 206.

The ingress 10 G optical Ethernet signals terminate on the XFP optics 184. The two 10 G serial streams are input to the 10 G LAN/WAN Rx Ethernet PHY 190 which functions to perform Ethernet clock recovery and distribution of the raw Ethernet data. The two XAUI receive signals are input to the two 10 G LAN/WAN Tx Ethernet PHY 228. The two 155.52 MHz WAN clocks are input to the 10 G WAN clock divider 198 which functions to divide the two WAN clocks down to the common rate of 8 kHz. The two WAN common rate clocks are input to multiplexer 206. The two 161.132 MHz LAN clocks are input to the 10 G LAN clock divider 200 which functions to divide the two LAN clocks down to the common rate of 8 kHz. The two LAN common rate clocks are input to multiplexer 206.

The TDM signals from the BITS 186 which may be from an external clock source such as GPS, telephone central office (CO), etc. These external clock sources are input to the E1/T1 LIU 192. The 2.048 MHz clock signal is input to the E1/T1 clock divider 204 which functions to divide the E1/T1 TDM signals down to the common rate of 8 kHz. The TDM common rate clocks are input to multiplexer 206.

Also input to the multiplexer 206 are 8 kHz clocks from a backplane clock source and from a CES TDM based interface card. The backplane clock source may comprise an Ethernet line card, internal clock source, etc. Note that although these clocks are already the common rate of 8 kHz, their phase may vary since they are derived from sources asynchronous with one another.

A clock source selection signal selects one of the common rate clock signals to be the primary clock and one to be the secondary clock. The selection is preferably made so that the input signal (i.e. optical Ethernet or CES clocks) derived from a high quality clock is chosen.

The primary and secondary common rate clocks are input to the DPLL/APLL 208 or other clock signal processing circuitry which performs all necessary functions such as jitter attenuation, holdover, smooth switchover and wander filtering. The clock source selection signal selects either the primary or secondary clock to use to generate the output clocks, including the 25 MHz clock, 2.048 MHz clock, 8 kHz backplane clock 238 and 8 kHz CES clock 239.

The 25 MHz clock is passed through a jitter attenuation circuit 210 for filtering out jitter in the clock signal. Note that this function may be performed by the DPLL or other equivalent circuit. The output of the jitter attenuation circuit is multiplexed with a 25 MHz LO 214. The multiplexer 216 is used to select either a normal mode or 'sync over Ethernet' mode. In normal mode, the clock output is used in the event no other clock signal is available or it is not desired to be in 'sync over Ethernet' mode. The 25 MHz clock output of the multiplexer is used as the clock source to the 100/1000 Mbps Ethernet PHY 222. The 1.25 G serial streams output of the Ethernet PHY 222 is input to the SFP optics 230. Rx and Tx 1.25 G serial streams are exchanged between the network processor and the Ethernet PHY 222. The output of the Ethernet PHY 222 is input to the SFP optics 230.

Note that the 25 MHz clock output of the DPLL/APLL 208 is also input to jitter attenuator/frequency multiplier 212 which functions to multiply the 25 MHz clock by 6.25 to yield a 156.25 MHz Ethernet LAN clock. The LAN clock is input to multiplexer 226 along with the 156.25 MHz LO 224 output. The output of the multiplexer 226 is input to the network processor 232 where it is used to synchronize the data output of the network processor.

The LAN clock is also input to multiplexer 220 along with the 156.25 MHz LO 218 output. The output of the multiplexer 220 is input to the 10 G LAN Tx Ethernet PHY 228 along with the 155.52 MHz WAN clock output of the DPLL/APLL 208 and the Tx XAUI streams from the network processor. The Rx XAUI streams output from the 10 G Rx Ethernet PHY 190 are input to the network processor. The serial stream output of the 10 G Tx Ethernet PHY is input to the XFP optics 234. The 2.048 MHz clock, also output of the DPLL/APLL 208 is input to the BITS 236.

1.25 G Clock and Data Recovery and Repeater 1:2

As described supra, the invention provides several alternative implementations of the 1.25 G clock and data recovery and repeater 1:2 circuits. Any of the following implementations may be used where the particular implementation used will likely be based on cost, board space and power constraints.

Figure 9:
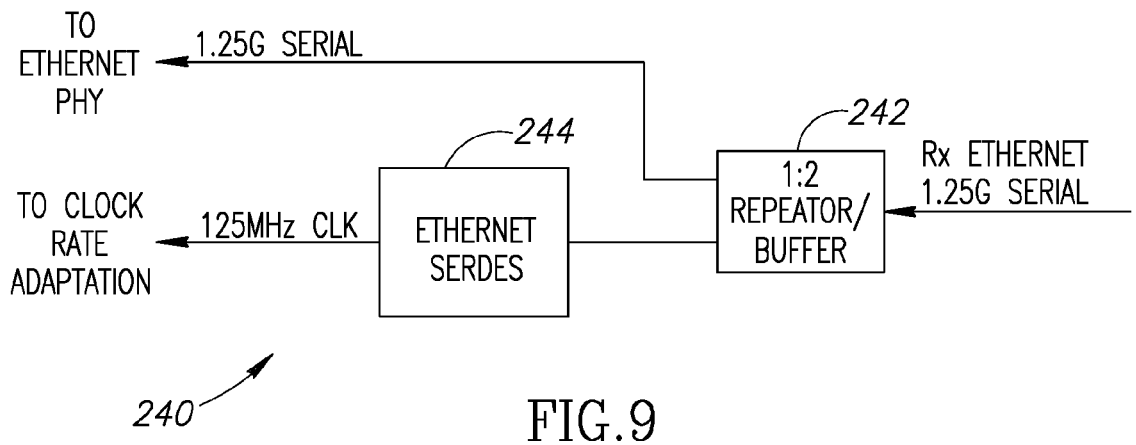
FIG. 9 is a block diagram illustrating a first alternative 1.25 G clock recovery embodiment the present invention.

A block diagram illustrating a first alternative 1.25 G clock recovery embodiment of the present invention is shown in FIG. 9. In this clock recovery implementation, generally referenced 240, the Rx Ethernet signal is input to a 1:2 repeater buffer 242 which duplicates the Rx Ethernet signal into two 1.25 G streams. One stream is input to the Ethernet PHY for data recovery while the second stream is input to the Ethernet Serialization/Deserialization (SERDES) circuit 244 which functions to generate a 125 MHz clock from the 1.25 G input stream. This clock signal is then input to the clock rate adaptation circuit.

Figure 10:
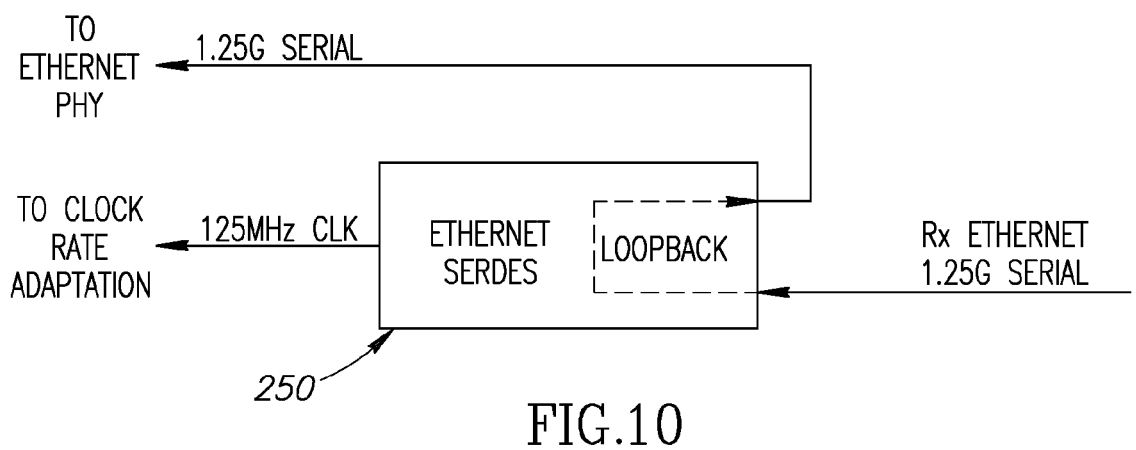
FIG. 10 is a block diagram illustrating a second alternative 1.25 G clock recovery embodiment the present invention.

A block diagram illustrating a second alternative 1.25 G clock recovery embodiment the present invention is shown in FIG. 10. In this clock recovery implementation the Rx Ethernet signal is input to the Ethernet SERDES circuit 250. The input of the SERDES, however, is placed in a loopback configuration whereby the output of the loopback is input to the Ethernet PHY for data recovery. The 125 MHz clock generated by the SERDES is input to the clock rate adaptation circuit.

Figure 11:
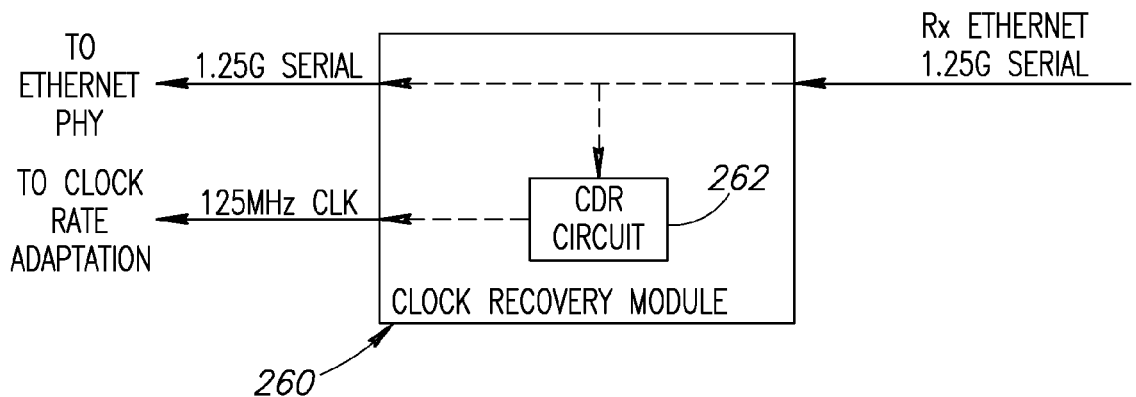
FIG. 11 is a block diagram illustrating a third alternative 1.25 G clock recovery embodiment the present invention.

A block diagram illustrating a third alternative 1.25 G clock recovery embodiment the present invention is shown in FIG. 11. In this clock recovery implementation the Rx Ethernet signal is input to a clock recovery module 260. The clock recovery module is configured to pass the 1.25 G Ex Ethernet stream to its output and to an internal clock and data recovery (CDR) circuit 262. The CDR circuit is operative to recover the 125 MHz clock which is then output to the clock rate adaptation circuit. The 1.25 G output stream is input to the Ethernet PHY for data recovery. The 125 MHz clock generated by the SERDES is input to the clock rate adaptation circuit.

In alternative embodiments, the methods of the present invention may be applicable to implementations of the invention in integrated circuits, field programmable gate arrays (FPGAs), chip sets or application specific integrated circuits (ASICs), DSP circuits, wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of distributing a centralized clock source synchronously over an asynchronous optical Ethernet network, said method comprising the steps of:
   receiving a plurality of available input asynchronous optical Ethernet signals of various rates, zero or more available input clock signals and zero or more input time division multiplexing (TDM) signals, and recovering clock signals therefrom, each recovered clock signal having a rate associated therewith;
   translating the rate of each receive clock signal and any available input clock signals to a common rate to generate a plurality of common rate receive clock signals;
   selecting one of said common rate receive clock signals to serve as a primary clock;
   generating one or more regenerated Ethernet clock signals and one or more output clock signals from said primary clock signal, wherein a separate Ethernet clock signal at a particular rate is generated for each required Ethernet clock; and
   generating one or more transmit optical Ethernet signals utilizing said regenerated Ethernet clock signals, thereby distributing a clock source over said asynchronous optical Ethernet network.

2. The method according to claim 1, wherein said input Ethernet signal comprises a 100 Mbps Fast Ethernet signal.

3. The method according to claim 1, wherein said optical Ethernet signal comprises a 1 G optical Ethernet signal.

4. The method according to claim 1, wherein said optical Ethernet signal comprises a 10 G optical Ethernet signal.

5. The method according to claim 1, wherein the selection of said primary clock source is based on clock quality measurements.

6. The method according to claim 1, wherein said input clock signals comprise one or more backplane clock input signals.

7. The method according to claim 1, wherein said input clock signals comprise one or more Clock Ethernet Synchronization (CES) card clock input signals.

8. The method according to claim 1, wherein said common rate is 8 kHz.

9. The method according to claim 1, further comprising the step of selecting a second clock signal from said plurality of common rate receive clock signals to serve as a secondary clock.

10. The method according to claim 1, further comprising the step of performing jitter attenuation on said one or more generated Ethernet clock signals.

11. The method according to claim 1, further comprising the step of generating and transmitting synchronization status messages adapted to convey clock quality information from one node to another in said asynchronous optical Ethernet network.

12. The method according to claim 1, wherein said step of generating one or more regenerated Ethernet clock signals utilizes a digital phase locked loop (PLL) circuit to generate said one or more Ethernet output clocks based on said primary clock.

13. The method according to claim 1, wherein said step of generating one or more regenerated Ethernet clock signals utilizes an analog phase locked loop (PLL) circuit to generate said one or more Ethernet output clocks based on said primary clock.

14. An apparatus for distributing a centralized clock source synchronously over an asynchronous optical Ethernet network, comprising:
   a plurality of clock recovery circuits operative to extract recovered clock signals from a plurality of input asynchronous optical Ethernet signals of various rates, zero or more available input clock signals and zero or more input time division multiplexing (TDM) signals, each recovered clock signal having a clock rate associated therewith;
   a clock rate adaptation circuit operative to translate the clock rate of each recovered clock signal to a common rate to generate a plurality of common rate receive clock signals thereby;
   selection means for selecting one of said plurality of common rate receive clock signals to serve as a primary clock; and
   a clock regeneration circuit operative to generate one or more regenerated Ethernet clock signals from said primary clock signal, wherein a separate Ethernet clock signal at a particular rate is generated for each required Ethernet transmit clock.

15. The apparatus according to claim 14, wherein said input Ethernet signal comprises a 100 Mbps Fast Ethernet signal.

16. The apparatus according to claim 14, wherein said input optical Ethernet signal comprises a 1 G optical Ethernet signal.

17. The apparatus according to claim 14, wherein said input optical Ethernet signal comprises a 10 G optical Ethernet signal.

18. The apparatus according to claim 14, wherein the selection of said primary clock source is based on clock quality measurements.

19. The apparatus according to claim 14, wherein said input clock signals comprises one or more backplane clock input signals.

20. The apparatus according to claim 14, wherein said input clock signals comprises one or more Clock Ethernet Synchronization (CES) card clock input signals.

21. The apparatus according to claim 14, wherein said common rate is 8 kHz.

22. The apparatus according to claim 14, wherein said selection means further comprises means for selecting a second clock signal from said plurality of common rate receive clock signals to serve as a secondary clock.

23. The apparatus according to claim 14, wherein said clock regeneration circuit comprises a jitter attenuation circuit.

24. The apparatus according to claim 14, wherein said clock regeneration circuit comprises a phase locked loop circuit.

25. The apparatus according to claim 14, further comprising means for generating and transmitting synchronization status messages adapted to convey clock quality information from one node to another in said asynchronous optical Ethernet network.

26. A method of distributing a centralized clock source synchronously over an asynchronous optical Ethernet network, said method comprising the steps of:
   receiving a plurality of ingress data signals from a plurality of optical Ethernet or zero or more time division multiplexing (TDM) signal sources and recovering a clock signal from each ingress data signal and TDM signal, each recovered clock signal having a clock rate associated therewith, wherein at least one of said ingress data signals is derived from a high quality clock;
   adapting the rate of each recovered clock signal to a common rate to yield a plurality of common rate clock signals;
   selecting a first common rate clock derived from a high quality clock to serve as a primary clock and a second common rate clock to serve as a secondary clock;
   generating one or more regenerated Ethernet clock signals from said primary clock signal, wherein a separate Ethernet clock signal at a particular rate is generated for each required Ethernet clock; and
   generating one or more transmit optical Ethernet signals utilizing said regenerated Ethernet clock signals, thereby distributing a high quality clock source over said asynchronous optical Ethernet network.

27. The method according to claim 26, wherein said step of receiving comprises receiving zero or more input clock sources and recovering a clock signal therefrom.

28. A provider edge switch for use in an asynchronous optical Ethernet based network, comprising:
   a plurality of line cards incorporating one or more ports for interfacing said provider edge switch to one or more users or other provider switches, each line card comprising:
      a plurality of ports, each port coupled to a network communications link;
      a packet processing engine coupled to said plurality of ports, said packet processing engine for determining forwarding decision and destination queue for each ingress packet;
      a queue manager coupled to said packet processing engine;
      a synchronous clock module for distributing a centralized clock source synchronously over an asynchronous optical Ethernet network, said synchronous clock module comprising:
         a plurality of clock recovery circuits operative to extract recovered clock signals from a plurality of input asynchronous optical Ethernet signals of various rates, zero or more available input clock signals and zero or more input time division multiplexing (TDM) signals, each recovered clock signal having a clock rate associated therewith;
         a clock rate adaptation circuit operative to translate the clock rate of each recovered clock signal to a common rate to generate a plurality of common rate receive clock signals thereby;
         selection means for selecting one of said plurality of common rate receive clock signals to serve as a primary clock;
         a clock regeneration circuit operative to generate one or more regenerated Ethernet clock signals from said primary clock signal, wherein a separate Ethernet clock signal at a particular rate is generated for each required Ethernet transmit clock; and
   switching means coupled to said queue manager and adapted to provide switching fabric functionality to said provider edge switch.

29. A core switch for use in an asynchronous optical Ethernet based network, comprising:
   a plurality of line cards incorporating one or more ports for interfacing said network edge switch to one or more users;
   a clock synchronization circuit coupled to said plurality of ports for distributing a centralized clock source synchronously over said asynchronous optical Ethernet network, said clock synchronization circuit operative to:
      receive a plurality of available input asynchronous optical Ethernet signals of various rates, zero or more available input clock signals and zero or more input time division multiplexing (TDM) signals, and recover clock signals therefrom, each recovered clock signal having a rate associated therewith;
      translate the rate of each receive clock signal and any available input clock signals to a common rate to generate a plurality of common rate receive clock signals;
      select one of said common rate receive clock signals to serve as a primary clock;
      generate one or more regenerated Ethernet clock signals and one or more output clock signals from said primary clock signal, wherein a separate Ethernet clock signal at a particular rate is generated for each required Ethernet clock; and
      generate one or more transmit optical Ethernet signals utilizing said regenerated Ethernet clock signals thereby distributing a clock source over said asynchronous optical Ethernet network.

\* \* \* \* \*